United States Patent
Min et al.

(10) Patent No.: US 10,950,762 B2
(45) Date of Patent: Mar. 16, 2021

(54) ROUND CHIP SCALE PACKAGE AND MANUFACTURING METHOD THEREFOR

(71) Applicant: LIGHTIZER CO., LTD, Gyeonggi-do (KR)

(72) Inventors: Jae-Sik Min, Seongnam-si (KR);
Jae-Yeop Lee, Seongnam-si (KR);
Byoung-Gu Cho, Seongnam-si (KR);
Byoung-Chul Cho, Seongnam-si (KR);
Byoung-Kwon Cho, Seongnam-si (KR)

(73) Assignee: LIGHTIZER CO., LTD

( * ) Notice: Subject to any disclaimer, the term of this patent is extended or adjusted under 35 U.S.C. 154(b) by 0 days.

(21) Appl. No.: 16/333,584

(22) PCT Filed: Apr. 17, 2017

(86) PCT No.: PCT/KR2017/004101
§ 371 (c)(1),
(2) Date: Mar. 14, 2019

(87) PCT Pub. No.: WO2018/190449
PCT Pub. Date: Oct. 18, 2018

(65) Prior Publication Data
US 2019/0259921 A1    Aug. 22, 2019

(30) Foreign Application Priority Data
Apr. 13, 2017  (KR) .................. 10-2017-0047910

(51) Int. Cl.
*H01L 33/50* (2010.01)
*H01L 33/44* (2010.01)
*H01L 33/00* (2010.01)

(52) U.S. Cl.
CPC ............ *H01L 33/505* (2013.01); *H01L 33/44* (2013.01); *H01L 33/50* (2013.01); *H01L 33/00* (2013.01); *H01L 2933/0041* (2013.01)

(58) Field of Classification Search
CPC ....... H01L 33/505; H01L 33/50; H01L 33/44; H01L 33/00; H01L 33/486; H01L 2933/0041
See application file for complete search history.

(56) References Cited

U.S. PATENT DOCUMENTS

| | | | |
|---|---|---|---|
| 2008/0048200 A1* | 2/2008 | Mueller | .................. B29C 41/14 257/98 |
| 2011/0057205 A1* | 3/2011 | Mueller | ................ H01L 33/504 257/84 |

(Continued)

FOREIGN PATENT DOCUMENTS

| | | |
|---|---|---|
| EP | 2804925 B1 | 12/2016 |
| JP | 2013229438 A | 11/2013 |

(Continued)

OTHER PUBLICATIONS

ISA Korean Intellectual Property Office, International Search Report Issued in Application No. PCT/KR2017/004101, dated Jan. 8, 2018, WIPO, 4 pages.

*Primary Examiner* — Sitaramarao S Yechuri
(74) *Attorney, Agent, or Firm* — The Belles Group, P.C.

(57) ABSTRACT

The present invention provides a round chip scale package comprising: a light emitting diode for providing blue light from a side surface and an upper surface thereof; and a three-dimensional fluorescent layer arranged to encompass the side surface and the upper surface of the light emitting diode, thereby converting the blue light emitted from the side surface and the upper surface of the light emitting diode into white light, wherein the three-dimensional fluorescent layer comprises a phosphor and silicon, and an edge region of the three-dimensional fluorescent layer is formed into a round shape.

6 Claims, 2 Drawing Sheets

(56) References Cited

U.S. PATENT DOCUMENTS

| | | | | |
|---|---|---|---|---|
| 2012/0044667 A1* | 2/2012 | Hanawa | ............... | H01L 33/46 |
| | | | | 362/97.1 |
| 2013/0189803 A1* | 7/2013 | Nasaani | ............... | C09K 11/70 |
| | | | | 438/27 |
| 2014/0291610 A1* | 10/2014 | Tseng | ............... | H01L 33/504 |
| | | | | 257/13 |
| 2015/0159836 A1* | 6/2015 | Tamaki | ............... | H05B 33/12 |
| | | | | 362/84 |
| 2016/0315218 A1* | 10/2016 | Bour | ............... | H01L 33/06 |
| 2016/0320689 A1* | 11/2016 | Butterworth | ............ | H01L 33/58 |
| 2017/0025582 A1* | 1/2017 | Dai | ............... | H01L 33/505 |
| 2017/0062669 A1* | 3/2017 | Yamasuge | ............ | H01L 33/507 |

FOREIGN PATENT DOCUMENTS

| KR | 1020080070193 A | 7/2008 |
|---|---|---|
| KR | 101543279 B1 | 8/2015 |
| KR | 1020150137298 A | 12/2015 |
| KR | 101645329 B1 | 7/2016 |

\* cited by examiner

ROUND CHIP SCALE PACKAGE AND MANUFACTURING METHOD THEREFOR

CROSS-REFERENCE TO RELATED APPLICATIONS

The present application is a U.S. National Phase of International Patent Application Serial No. PCT/KR2017/004101 entitled "ROUND CHIP SCALE PACKAGE AND MANUFACTURING METHOD THEREFOR," filed on Apr. 17, 2017. International Patent Application Serial No. PCT/KR2017/004101 claims priority to Korean Patent Application No. 10-2017-0047910, filed on Apr. 13, 2017. The entire contents of each of the above-cited applications are hereby incorporated by reference for all purposes.

TECHNICAL FIELD

The present invention relates to a round chip scale package and a method of manufacturing the same, and more particularly, to a round chip scale package and a method of manufacturing the same, for rounding an edge region of a three-dimensional (3D) phosphor layer for converting blue light into white light to effectively prevent cracks due to silicon present in a phosphor layer.

BACKGROUND ART

Recently, a light emitting diode formed by adding aluminium (Al) or indium (In) to GaN has attracted attention due to a long lifespan, lower power consumption, excellent brightness, eco-friendly features that do not adversely affect the human body, and so on compared with a conventional incandescent lamp and, in particular, a light emitting diode chip that employs a chip scale package to provide white light has attracted much attention.

A light emitting diode applied to the aforementioned chip scale package emits blue light from side and upper surfaces thereof and, to convert the emitted blue light into white light, a phosphor layer needs to be disposed on the side and upper surfaces of the light emitting diode.

A conventional chip scale package is configured in such a way that a plurality of light emitting diodes are arranged at a constant interval and a mixed liquid of phosphor and silicon are wholly coated and then hardened on the resultant structure. The solidified phosphor and silicon are planarized using a lapping procedure to adjust the thickness of the phosphor layer and chips are separated from each other using a sawing procedure.

To perform conventional manufacturing procedures of a chip scale package, the phosphor layer is inevitably exposed to a temperature environment of −20° C. to 140° C. Due to this temperature difference, silicon of the phosphor layer cracks due to fatigue and the crack is mainly caused at an edge region of the phosphor layer.

The background art of the present invention is disclosed in Korean Patent Application No. 10-2008-0070193.

DISCLOSURE

Technical Problem

An object of the present invention is to provide a round chip scale package for rounding an edge region of a three-dimensional (3D) phosphor layer for converting blue light into white light to effectively prevent cracks due to silicon present in a phosphor layer.

Another object of the present invention is to provide a method of effectively manufacturing the aforementioned round chip scale package.

It is to be understood that objects of the present invention are not limited by the aforementioned objects and both the foregoing general description and the following detailed description of the present invention are exemplary and explanatory and are intended to provide further explanation of the invention as claimed.

Technical Solution

In one general aspect, a round chip scale package includes a light emitting diode for providing blue light from side and upper surfaces thereof, and a three-dimensional (3D) phosphor layer disposed to surround the side and upper surfaces of the light emitting diode to convert the blue light emitted from the side and upper surfaces of the light emitting diode into white light, wherein the 3D phosphor layer includes phosphor and silicon and an edge region of the 3D phosphor layer has a round shape.

The light emitting diode may have a regular hexahedron or rectangular parallelepiped shape.

The 3D phosphor layer may have a regular hexahedron or rectangular parallelepiped shape.

The phosphor in the 3D phosphor layer may be uniformly distributed.

The phosphor may be uniformly distributed in the 3D phosphor layer to sink downward.

The round shape formed at the edge region of the 3D phosphor layer may have a curvature radius of 0.1 mm to 0.5 mm.

In another general aspect, a method of manufacturing a round chip scale package includes disposing a light emitting diode for providing blue light from side and upper surfaces thereof, on a substrate, preparing a mold frame of three-dimensional (3D) phosphor, to be disposed to surround the side and upper surfaces of the light emitting diode, injecting a mixed liquid of phosphor and silicon into the mold frame, coupling the mold frame into which the mixed liquid is injected to the substrate on which the light emitting diode is disposed, and forming the 3D phosphor by performing a baking procedure in a state in which the mold frame into which the mixed liquid is injected is coupled to the substrate on which the light emitting diode is disposed, wherein the mixed liquid has viscosity of 2,000 to 50,000 cps and the edge region of the 3D phosphor layer has a round shape.

The round shape formed at the edge region of the 3D phosphor layer may have a curvature radius of 0.1 mm to 0.5 mm.

Advantageous Effects

According to an exemplary embodiment of the present invention, a round chip scale package may effectively prevent cracks due to silicon present in a phosphor layer by rounding an edge region of a three-dimensional (3D) phosphor layer for converting blue light into white light.

According to an exemplary embodiment of the present invention, a method of manufacturing a round chip scale package may effectively manufacture the aforementioned round chip scale package.

BEST MODE

Hereinafter, the embodiments of the present invention will be described in detail with reference to accompanying drawings.

A round chip scale package according to an exemplary embodiment of the present invention may include a light emitting diode 1200 for providing blue light from side and upper surfaces thereof, and a three-dimensional (3D) phosphor layer 1100 that is disposed to surround the side and upper surfaces of the light emitting diode 1200 and converts the blue light emitted from the side and upper surfaces of the light emitting diode 1200 into white light.

Figure 1:
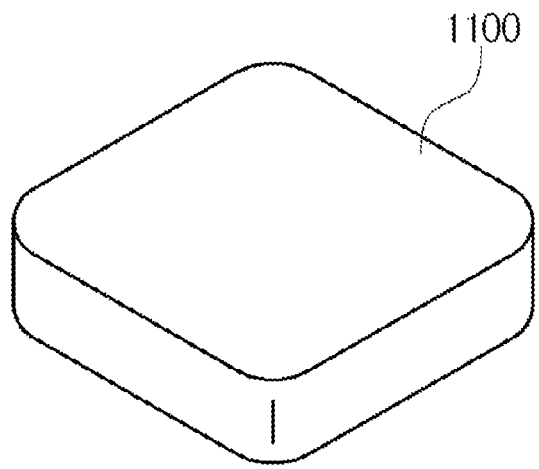
FIG. 1 is a perspective view of a round chip scale package according to exemplary embodiments of the present invention.
Figure 2:
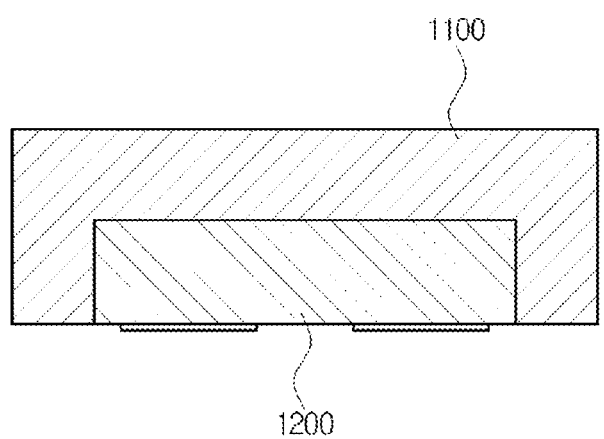
FIG. 2 is a cross-sectional view of a round chip scale package according to exemplary embodiments of the present invention.

Here, the 3D phosphor layer 1100 may include phosphor and silicon and the edge region of the 3D phosphor layer 1100 may be formed in a round shape as shown in FIG. 1 or 2.

In detail, the round shape of the edge region of the 3D phosphor layer 1100 may have a curvature radius of 0.1 mm to 0.5 mm.

Here, the light emitting diode 1200 may have a regular hexahedron or rectangular parallelepiped shape and the 3D phosphor layer 1100 may have the same shape as that of the light emitting diode 1200. That is, when the light emitting diode 1200 has a regular hexahedron shape, the 3D phosphor layer 1100 may have a regular hexahedron shape and, when the light emitting diode 1200 has a rectangular parallelepiped shape, the 3D phosphor layer 1100 may have a rectangular parallelepiped shape.

Phosphor may be uniformly distributed in the 3D phosphor layer 1100 or may be distributed to sink downward.

The round chip scale package according to an exemplary embodiment of the present invention may be configured in such a way that the edge region of the 3D phosphor layer 1100 is rounded to effectively prevent cracks, which mainly occurs at the edge region due to silicon of the 3D phosphor layer 1100.

Accordingly, all edge regions of the 3D phosphor layer 1100 may be rounded.

Viewed from the above, the 3D phosphor layer 1100 may have a rectangular shape as shown in FIG. 1. When the light emitting diode 1200 has a square shape, the 3D phosphor layer 1100 has a square shape viewed from the above and, when the light emitting diode 1200 has a rectangular shape, the 3D phosphor layer 1100 has a rectangular shape viewed from the above.

Figure 3A:
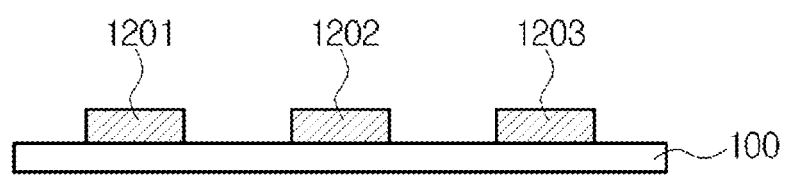
FIGS. 3A to 3E are cross-sectional views for respective operations of a method of manufacturing a round chip scale package according to an exemplary embodiment of the present invention.

In a method of manufacturing a round chip scale package according to an exemplary embodiment of the present invention, first, referring to FIG. 3A, light emitting diodes 1201, 1202, and 1203 that provide blue light from side and upper surfaces may be disposed on a substrate 100.

Figure 3B:
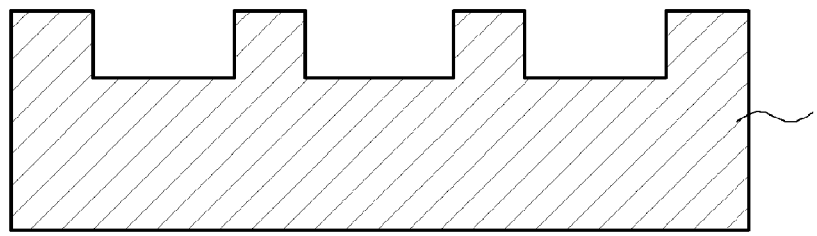

Then, as shown in FIG. 3B, a mold frame 200 of 3D phosphor, to be disposed to surround the side and upper surfaces of the light emitting diodes 1201, 1202, and 1203, may be prepared.

Figure 3C:
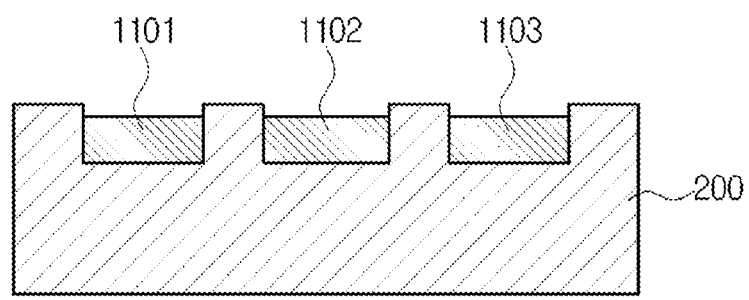

Then, as shown in FIG. 3C, mixed liquids 1101, 1102, and 1103 of phosphor and silicon may be injected into the mold frame 200. Here, the mixed liquids 1101, 1102, and 1103 may have viscosity of 2,000 to 50,000 cps.

Figure 3D:
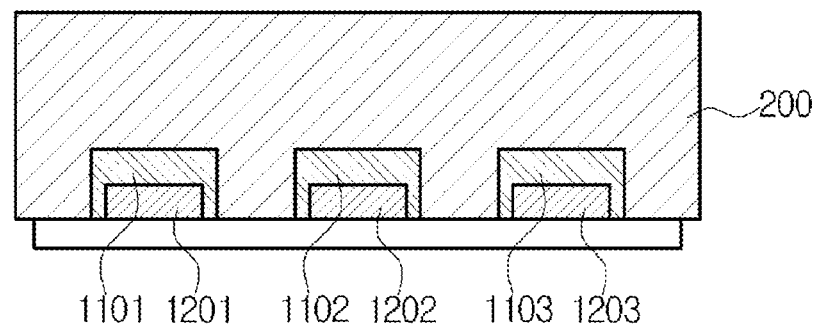

Then, as shown in FIG. 3D, the mold frame 200 into which the mixed liquids 1101, 1102, and 1103 are injected may be reversed and may be coupled to the substrate 100 on which the light emitting diodes 1201, 1202, and 1203 are disposed.

Figure 3E:
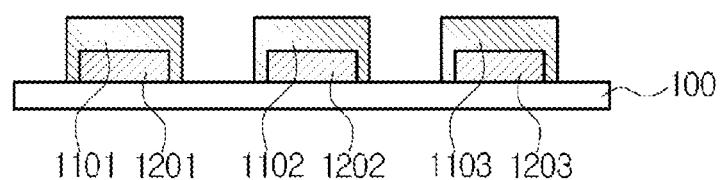

Then, as shown in FIG. 3E, a baking procedure may be performed in a state in which the mold frame 200 in which the mixed liquids 1101, 1102, and 1103 are injected and the substrate 100 on which the light emitting diodes 1201, 1202, and 1203 are disposed are coupled to each other to form the 3D phosphor layer 1101, 1102, and 1103 and the mold frame 200 may be removed.

Here, the 3D phosphor layer 1101, 1102, and 1103 may include phosphor and silicon and the edge region of the 3D phosphor layer 1101, 1102, and 1103 may be formed in a round shape as shown in FIG. 1.

In detail, the round shape of the 3D phosphor layer 1101, 1102, and 1103 may have a curvature radius of 0.1 mm to 0.5 mm.

A method of manufacturing a round chip scale package according to an exemplary embodiment of the present invention may round the edge region of the 3D phosphor layer 1101, 1102, and 1103 to effectively prevent cracks, which mainly occurs at the edge region due to silicon of the 3D phosphor layer 1101, 1102, and 1103.

Accordingly, all regions of the 3D phosphor layer 1101, 1102, and 1103 may be rounded.

Viewed from the above, the 3D phosphor layer 1101, 1102, and 1103 may have a rectangular shape as shown in FIG. 1. When the light emitting diodes 1201, 1202, and 1203 each have a square shape, the 3D phosphor layer 1101, 1102, and 1103 has a square shape viewed from the above and, when the light emitting diodes 1201, 1202, and 1203 each have a rectangular shape, the 3D phosphor layer 1101, 1102, and 1103 has a rectangular shape viewed from the above.

Thus far, although exemplary embodiments of the present invention have been described to explain the principle of the present invention, the present invention is not limited by the described constructions or features of the present invention.

In addition, those skilled in the art will appreciate that many modifications and changes can be made to the present invention without departing from the spirit and essential characteristics of the present invention.

Thus, any appropriate modifications, changes, and equivalents may be considered to belong to the scope of the present invention.

The invention claimed is:

1. A method of manufacturing a rounded chip scale package, the method comprising:

disposing a light emitting diode for providing blue light from first side surfaces and a first upper surface thereof, on a substrate;

preparing a mold frame of three-dimensional (3D) phosphor, to be disposed to surround the first side and upper surfaces of the light emitting diode;

injecting a mixed liquid of phosphor and silicon into the mold frame; coupling the mold frame into which the mixed liquid is injected to the substrate on which the light emitting diode is disposed; and forming the 3D phosphor by performing a baking procedure in a state in which the mold frame into which the mixed liquid is injected is coupled to the substrate on which the light emitting diode is disposed, wherein the mixed liquid has viscosity of 2,000 to 50,000 cps, wherein the 3D phosphor is disposed surrounding the first side surfaces and the first upper surface of the light emitting diode, converts blue light emitted from the first side surfaces and the first upper surface of the light emitting diode into white light, and comprises second side surfaces and a second upper surface from which the converted white light is emitted, wherein an edge region of the 3D phosphor layer comprises:
- a first region adjacent to one of the second side surfaces and the second upper surface,
- a second region in which two adjacent side surfaces of the second side surfaces are adjacent, and
- a third region in which the two adjacent side surfaces of the second side surfaces and the second upper surface are adjacent to each other, wherein the edge region of the 3D phosphor layer has a rounded shape, and wherein the mold frame has an area corresponding to the edge area.

2. The method of claim 1, wherein the rounded shape formed at the edge region of the 3D phosphor layer has a curvature radius of 0.1 mm to 0.5 mm.

3. The method of claim 1, wherein the light emitting diode has a regular hexahedron or rectangular parallelepiped shape.

4. The method of claim 1, wherein the 3D phosphor layer has a regular hexahedron or rectangular parallelepiped shape.

5. The method of claim 1, wherein the phosphor in the 3D phosphor layer is uniformly distributed.

6. The method of claim 1, wherein the phosphor is uniformly distributed in the 3D phosphor layer to sink downward.

\* \* \* \* \*